United States Patent [19]
Friz

[11] Patent Number: 5,291,146
[45] Date of Patent: Mar. 1, 1994

[54] TRANSVERSE TRAVELING WAVE AMPLIFIER

[75] Inventor: Walter Friz, Fairborn, Ohio

[73] Assignee: The United States of America as represented by the Secretary of the Air Force, Washington, D.C.

[21] Appl. No.: 958,434

[22] Filed: Oct. 7, 1992

Related U.S. Application Data

[63] Continuation-in-part of Ser. No. 853,553, Mar. 18, 1992, abandoned.

[51] Int. Cl.5 .............................................. H03F 3/58
[52] U.S. Cl. ..................................... 330/43; 315/3.5; 315/39.3
[58] Field of Search ................... 330/43, 44, 5, 4.6, 330/4.7; 315/39.3, 3.5

[56] References Cited

U.S. PATENT DOCUMENTS

| | | | |
|---|---|---|---|
| 2,708,236 | 5/1955 | Pierce | 330/49 |
| 3,038,100 | 6/1962 | Harrison | 330/43 |
| 3,110,839 | 11/1963 | Trivelpiece | 330/43 |
| 4,132,956 | 1/1979 | Russer | 330/5 |
| 4,151,476 | 4/1979 | Jasper, Jr. | 330/43 |
| 4,733,195 | 3/1988 | Tserng et al. | 330/286 |
| 4,887,049 | 12/1989 | Krowne | 330/286 |
| 4,967,162 | 10/1990 | Barnett et al. | 330/43 |

Primary Examiner—Robert J. Pascal
Assistant Examiner—Tan Dinh
Attorney, Agent, or Firm—Bernard E. Franz; Thomas L. Kundert

[57] ABSTRACT

The RF amplifier has a single waveguiding structure extending longitudinally in a direction of propagation of electromagnetic waves, in which density of an injected current flow is not RF modulated, and a transverse E-field component vector of the electromagnetic waves interacts with the electron flow by electron transit time effects. The waveguiding structure comprises a metallic top strip 1 and a metallic ground strip 2 held apart by two ceramic supports 3 which integrate the two strips into a vacuum tight enclosure together with two RF transparent dielectric windows 4 and 5 which represent the amplifier input and output respectively. Electron flow is generated in a linear current injection system by electronic emitters providing a cathodic source of electron flow which is injected into the waveguiding structure, with a flow vector orientation transverse to the direction of propagation of said electromagnetic waves. The electron flow enters the stripline interior space through an extended slot along the middle of the ground strip, after interaction with the wavefield leaves the waveguiding structure through a longitudinal slot in the metallic top strip, and is then collected by a collector 10 which straddles the slot over its entire length.

7 Claims, 2 Drawing Sheets

TRANSVERSE TRAVELING WAVE AMPLIFIER

RIGHTS OF THE GOVERNMENT

The invention described herein may be manufactured and used by or for the Government of the United States for all governmental purposes without the payment of any royalty.

This application is a continuation-in-part of application Ser. No. 07/853,553, filed Mar. 8, 1992 as now abandoned.

BACKGROUND OF THE INVENTION

The present invention relates generally to the art of microcircuit millimeter wave amplifiers. More particularly, the invention relates to a device (a transverse traveling wave amplifier) for extending the bandwidth of a millimeter-wave wide band amplifier for use in microcircuits. Although the concept appears to be uniquely suited for microelectronics applications and associated fabrication methods it also has features that may offer distinct advantages in conventional classical electronics systems.

In spite of the generally exhilarating advances in solid state miniature technology in recent years, the progress with wide band microwave and millimeter wave amplifiers had always suffered from the natural limitations that are imposed by the physics and material properties of solid state devices. At the same time the temperature sensitivity of the electronics interfaces due to the properties of the constituent materials (Si, GaAs) is viewed as troublesome in future specialized applications.

A basic limitation of customary solid state devices for microwave amplifiers resides with their being a lumped circuit with two or three electrical terminals. As such, they suffer from the conflict between their size and the wavelength of the operational signal. The application of the modern most elegant amplification principle of continuous signal wave field interaction with an energy providing spatially extended electron flow is forestalled because the coherence time/length in solid state electron flows is extremely small, much smaller than a signal period/wavelength so the vital interplay between electron density and electron velocity modulation cannot develop. The lack of opportunity to avail of this interplay restricts solid state technology to a control of the electron flow density by an electrode in a faucet like fashion which necessitates the familiar approach by a three-terminal device and its use in a lumped element circuit. The consequences of this situation manifest themselves in the non-attainability of useful amplifier gain bandwidth performance beyond 50 GHz.

The recent advent of microfabricated gate controlled field emitter devices, although again three (or four) terminal devices, with very appealing physical characteristics, justify hopes for successful penetration of the millimeter wave region beyond 50 GHz. Initially this hope was carried by the extremely short electron transit time in these devices ($\sim 10^{-12}$ sec.) during which the electron behaves completely ballistic. But application of these very small four-element entities, as a combined network, in a distributed amplifier and its assessment in projective computational designs yields upper frequency limits that lag one to two orders behind a frequency equivalent to the inverse transit time.

The following United States patents are of interest.
U.S. Pat. No. 4,132,956—Russer
U.S. Pat. No. 4,151,476—Jasper, Jr.
U.S. Pat. No. 4,733,195—Tserng
U.S. Pat. No. 4,887,049—Krowne
U.S. Pat. No. 2,708,236—Pierce
U.S. Pat. No. 3,038,100—Harrison
U.S. Pat. No. 3,110,839—Trivelpiece
U.S. Pat. No. 4,967,162—Barnett et al The patent to Russer teaches a device wherein electromagnetic waves are amplified by traveling through superconductive tunnel layers. The patent to Jasper teaches a device wherein electromagnetic waves are propagated through a serpentine stripline in the presence of a magnetic field. The patent to Tserng teaches a device wherein an electromagnetic wave is applied to a series of interconnected FETs. The patent to Krowne teaches a solid state harmonic amplifier wherein electromagnetic waves are applied by a pair of microstrips to a grating region wherein they cause RF amplification.

Pierce (U.S. Pat. No. 2,708,236) discloses an RF waveguide amplifier. Harrison (U.S. Pat. No. 3,038,100) discloses an RF traveling wave tube amplifier. Trivelpiece (U.S. Pat. No. 3,110,839) discloses an RF traveling wave tube.

Barnett et al (U.S. Pat. No. 4,967,162) describe a novel stripline device which was an extension of a distributed amplifier device published in 1948 (E. L. Ginston, W. R. Hewlett, J. H. Tasberg and J. D. Noe, "Distributed Amplification", Proc. IRE, pp 956-969, August 1948). That publication and the Barnett et al patent rely on the triode principle as means for energy conversion and amplification mechanism. That principle is described by modulation of an electron current emitted from a cathodic electrode by a control electrode generally called gate or grid. After leaving the cathode-gate area, this current modulated electron flow is now capable to deliver power to an external circuit via an anodic electrode. In an extended, distributed or stripline device these above-described electrodes are given a linearly extended shape of transmission lines retaining locally the same operational design features found in the parental designs. The Barnett et al patent confirms that position throughout all of its explanations, specifically so by comments on its figures which clearly distinguish between an RF gate stripline and the other RF stripline(s). Also, the comments on phase velocity point out the necessity of matched propagation of signals since there are separate lines.

A paper by Walter Friz and Morris Ettenberg titled "The Simtron Concept" presented orally at the 3rd International Conference on "Vacuum Micro Electronics", Monterey Calif., July 1990 describes a novel form of a high frequency amplifier which is suitable for realization in a vacuum microelectronics structure. The cathode is a linear array of field emitters or a linear ridge emitter. The rf structure is a Coplanar Waveguide (CPW) which may be fabricated by planar techniques as in solid state devices. The CPW is a TEM transmission line and the interaction may be regarded as an extended triode with spatial variation according to the wavelength. Hence the name SIMTRON - Spatial Injection Modulation of elecTRONs.

SUMMARY OF THE INVENTION

An objective of the invention is to alleviate the impasse that exists with millimeter-wave wide band amplification in microcircuit technology. This invention also contributes to an extension to the existing possibilities in conventional microwave and millimeter-wave technology. The new art introduced by this disclosure allows the achievement of 20 to 40% bandwidth together with good gains at power levels substantially beyond solid state technology as practiced today.

The invention obviates the existing difficulties and frequency limitation by introducing an amplifier design concept that makes use of the continuous wave field electron flow principle in the microwave format. Specifically, it relates to an amplifier with a longitudinally extending wave guiding structure in which the transverse E-field component vector interacts with the velocity of an electron flow that penetrates the wave guiding structure in the same transverse direction. The dynamics of the interplay between electrons and the signal field lead to a net energy transfer from electrons to the field, providing that certain relations between electron velocity, interaction length (wave guide transverse dimension), and signal frequency are maintained. The numerical magnitudes of these quantities endorse this amplifier principle as a millimeter amplifier candidate for microcircuit applications in particular but also make it suitable for conventional systems.

The RF amplifier according the invention comprises a single waveguiding structure extending longitudinally in a direction of propagation of electromagnetic waves, the waveguiding structure being part of an evacuated enclosure; an RF transparent dielectric window for introducing electromagnetic waves from an RF source into said waveguiding structure; electron emitters providing a cathodic source of electron flow which is injected into the waveguiding structure, with a flow vector orientation being transverse to the direction of propagation of said electromagnetic waves, wherein density of the injected current flow is not RF modulated; wherein a transverse E-field component vector of the electromagnetic waves interacts with the electron flow to produce an increase in the energy level of said electromagnetic waves by electron transit time effects; and means for collecting said electron flow after interaction with said electromagnetic waves.

FEATURES

The following list of features relate to the preferred embodiment and a number of alternative embodiments.

1. An RF amplifier for electromagnetic signals which comprises:
   an EM wave guiding structure extending longitudinally in the direction of wave propagation;
   an arrangement of electron flow with a current flow vector orientation perpendicular to the direction of wave propagation and simultaneously aligned collinearly with an electric vector component of the EM field;
   an injection system for the electron flow consisting of electron source(s) and flow direction electrodes;
   input and output provisions of suitable geometry for allowing entry and exit of the EM signal;
   input and output, and lateral cross sectional design provisions to permit evacuation of air/gases from the electronic interaction region and electron flow system;
   a longitudinally extending collector system for collecting the electron flow after passage through the interaction space.
2. The amplifier of feature 1 wherein the waveguiding structure is an inverted metallic stripline with dielectrically closed sides.
3. The amplifier of feature 1 wherein the waveguiding structure is a metallic waveguide with rectangular cross section.
4. The amplifier of feature 1 wherein the waveguiding structure is a metallic waveguide with elliptical cross section.
5. The amplifier of feature 1 wherein the waveguiding structure is a metallic waveguide with an internal ridge(s).
6. The amplifier of feature 1 wherein the waveguiding structure is a periodic delay line.
7. The amplifier of feature 6 wherein the waveguiding structure consists of two flat identical meander lines vertically offset by the height of the electron interaction space.
8. The amplifier of feature 6 wherein the waveguiding structure consists of two flat identical sets of coupled halfwave length resonator filter elements in longitudinal arrangement along with amplifier direction.
9. The amplifier of feature 6 wherein the waveguiding structure consists of a helical conductor.
10. The amplifier of feature 1 wherein the electron flow originates from a series of field emitter cathodes controlled by a gate electrode(s) and guided by additional electrode(s) prior to entry into the interaction space inside the wave guiding structure.
11. The amplifier of feature 10 wherein the field emitter cathodes are replaced by thermionic cathodes.
12. The amplifier of feature 10 wherein the electron flow originates from a linear succession of individual, or groups of, field emitter cathode tips located along the length of the waveguiding structure.
13. The amplifier of feature 10 wherein the electron flow originates from one or a series of linear wedge type field emitting cathodes located along the length of the waveguiding structure.
14. The amplifier of feature 10 wherein the electron flow originates from a suitably chosen distribution density of field emitting cathodes within the ground plane or below, but within the confines of the projection of the lateral limits of the wave guiding structure.

DETAILED DESCRIPTION OF THE PREFERRED EMBODIMENT

Figure 1:
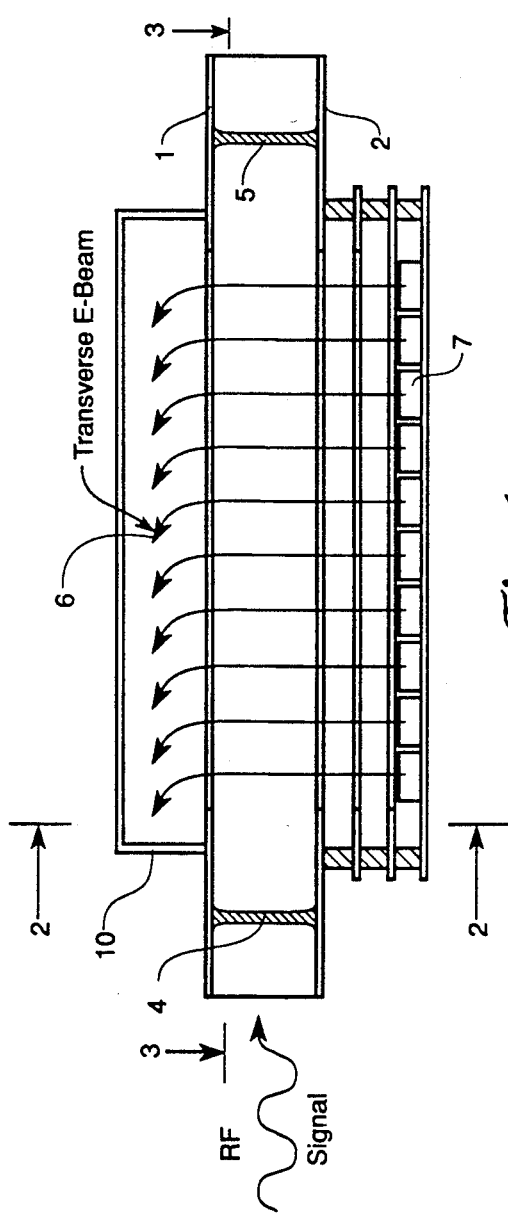
FIG. 1 is a side sectional view of the device.
Figure 3:
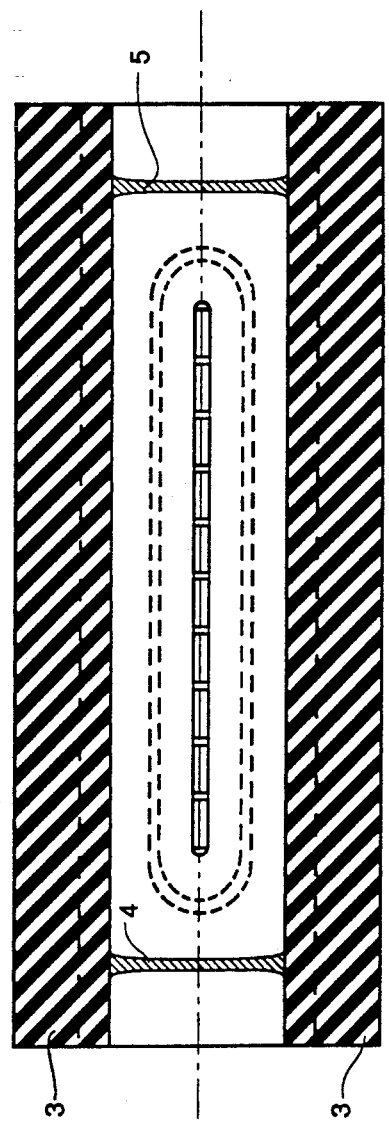
FIG. 3 is a longitudinal sectional view taken along lines 3—3 of FIG. 1.

FIG. 1 is a simplified engineering drawing of a preferred embodiment of the proposed device concept. A metallic top strip 1 and a ground strip 2 of an inverted stripline form the backbone of the amplifier. The two strips are held apart by two ceramic supports 3 which integrate the two strips 1 and 2 into a vacuum tight enclosure together with two RF transparent dielectric windows 4 and 5 which represent the amplifier input and output respectively. Electron flow is generated in a linear current injection system and enters the stripline interior space through an extended slot along the middle of the ground strip 2. This current injection system comprises a linearly arrayed group of wedge type or coneshaped field emitters 7 which are a cathodic source of electrons. Their number and packing density is predicated by the requirements of amplifier gain and output power. The electron emission is largely determined by an applied potential difference between cathodes and this gate electrode system 8 a and to a lesser degree by voltages applied to subsequent electrodes 9 for beam current shaping and velocity adjustments. (In certain applications the use of thermionic cathodes may be advantageous instead of the above mentioned field emitter cathodes.)

The electron flow after interaction with the wavefield leaves the wave guiding structure through a longitudinal slot in the metallic top strip 1 and is then collected by the collector 10 which straddles the slot over its entire length and forms, thereby, the completing element for a vacuum tight enclosure of the amplifier device.

The concept proposed herein relies on a different principle of interaction from that disclosed by Barnett et al, which becomes apparent by the different device architecture, i.e., only a single transmission line is used; whereas in the Barnett et al U.S. Pat. No. 4,967,162 at least two striplines are used, one to effect the RF modulation of the local electron current density and a second to extract the energy from the modulated electron flow. In my application the transit of the electrons is locally/-temporally modulated by the RF signal. The thereby effected change in transit time of the transverse electron flow presents itself as an electronic admittance with a negative real part over a preselected band of frequencies. This mechanism allows the design of very simple amplifiers consisting basically of only one transmission line with a built-in transverse electron flow as described herein.

Note herein that the density of current flow from the field emitters as it enters the interaction region is not RF modulated. This differs from the triode principle as means for energy conversion and amplification mechanism. The triode principle of the prior art is described by RF modulation of an electron current emitted from a cathodic electrode by a control electrode generally called gate or grid. After leaving the cathode-gate area this current modulated electron flow then is capable to deliver power to an external circuit via an anodic electrode. A triode stimulates and modulates the electron emission. My amplifier does not change emission, but relies on the change in the electron time of flight in the presence of an RF field. (Although there is no RF modulation, there may of course be pulse or audio modulation of the signal envelope to provide a useful device.)

Figure 2:
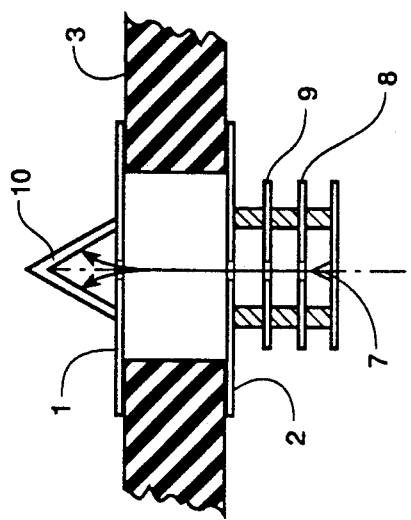
FIG. 2 is cross sectional view taken along lines 2—2 of FIG. 1.

Note that the elements 8 and 9 in FIG. 2 herein do not form a control electrode means, but are used solely for beam current shaping and velocity adjustments. Thus, these elements along with the field emitters 7 form an electron gun. My concept is equivalent to a two-electrode or single line device in a transit time amplifier/oscillator. The analysis herein describes a principle totally different from a class A triode or transistor.

A. DESCRIPTION OF DEVICE CONCEPTS

The invention relates to a novel type of amplifier for electromagnetic signals at very high frequencies ($10^9$ to $10^{11}$ Hz). The amplifier is of the continuous interaction, also called traveling wave type, genus of devices in which an E-M wave travels through an extended RF structure for interaction with an active medium, in this case a transverse electron flow.

Figure 4:
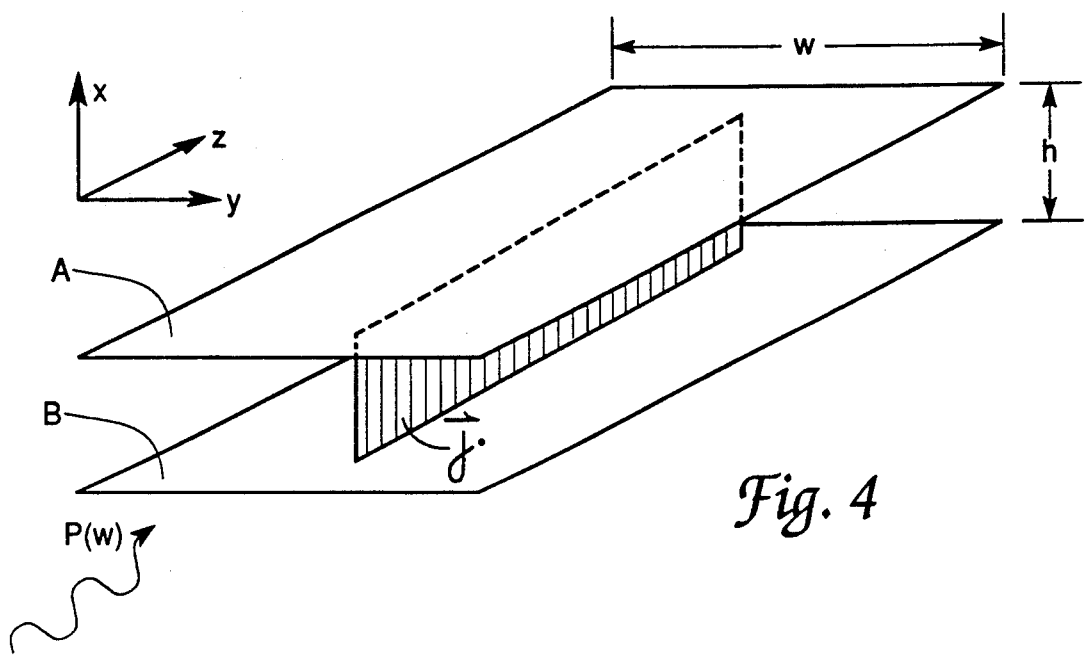
FIG. 4 is a schematical representation of the amplifier showing the stripline and the flow direction of the current sheet.

Referring now to FIG. 4 and the discussion which follows there is a more detailed explanation of the invention.

The RF structure is a transmission line, preferably one that propagates TEM modes; however, waveguides operated in a TE mode pattern may also be successfully used. In any such line an electron flow is arranged with its velocity vector collinearly with the TE field vector. This electron flow extends in a sheetlike fashion along the major axis of the RF structure. The particular pattern of the "footprint" of this electron flow, in the y-z plane normal to the current vector $\bar{J}$, is not essential although for a specific purpose some arrangement may be more advantageous than some other. The RF structure, chosen for this case, is a two-conductor stripline of width w and height h. It extends in the z direction of the adapted coordinate system. As long as the height h and width w are small against the signal wavelength $\lambda$ this line carries the EM wave energy in the TEM mode. In this case, the electric field vector E is roughly parallel to the x-axis. In the figure the electron flow appears as a current sheet which emerges from an extended electron source along the center line of the lower strip B. This source could be realized in different ways. It could for instance be an extended thermionic cathode from which electrons enter with zero velocity before being accelerated by the DC voltage $U_{AB}$, applied between the two constituent transmission line strips. A second realization of a current source could be the extended slot of the screen grid of a linear field emitter tetrode, extending over the line length in the direction. In both examples, the geometrical arrangement is that of a sheet or curtain of current rushing from strip B to the anodic strip A where the current is assumed to be collected. There is also the realization possible where the current emerges in a continuous distribution over the strip B with a more or less uniform density.

B. EXPLANATION OF AMPLIFIER OPERATION

The following considerations are based on the most simple case of a stripline amplifier model where a sheet beam emerges along the center of the bottom strip B and goes straight up to the center of strip A, where it is totally collected, without reflection. Strips A and B are both held at a voltage U which then is the equivalent represented by the electron kinetic energy $$2eU = mv_{el}^2$$

Lateral spread of the electrons over their length h of travel is assumed negligible. The signal enters the amplifier from the left (FIG. 4). The interaction of the E field in the circuit, as set up by the incoming signal, with the current sheet leads to an exchange of energy between the wave and the electrons. The incremental change of wave power along the line is given by:

$$\frac{dP}{dz} = -\iint_A \bar{E}(x,y,z,t) \cdot \bar{j}(x,y,z,t)\, dx dy \tag{1}$$

$A$ = Lateral crossection of $RF$ structure

We assume a well defined electron flow pattern by stating $$\bar{j}(x,y,z,t) = \bar{e}_x j(x,z,t)\delta(y - y_0); \tag{2}$$

with $\delta(y - y_0) = \begin{bmatrix} 1 & \text{for } y = y_0 \\ 0 & \text{for } y \neq y_0 \end{bmatrix}$ $y_0$ = symmetry line Therefore eq (1) becomes:

$$\frac{dP}{dz} = -\bar{e}_x \int_0^h E(x,y_0,t)\, j(x,z,t)\, dx \tag{3}$$

We further assume that in the center of the stripline, at $y = y_0$, the electric field vector is nearly independent of x, so that we are allowed to simplify in the case of a harmonic signal:

$$\bar{E}(x, y_0, z, t) \approx \bar{e}_x \tilde{E}(y_0, z)\sin\omega t \tag{4}$$

We now obtain for eq (3):

$$\frac{dP}{dz} = -\tilde{E}(y_0,z)\sin\omega t \int_0^h j(x,z,t)\, dx \tag{5}$$

The integral on the right side of eq (5), aside from the factor $$\text{factor } \frac{1}{h}$$

is called the induced current $$j_{ind}^{(t)} = \frac{1}{h}\int_0^h j(x,z,t)\, dx \tag{6}$$

The adjective "induced" makes reference to the concomitant RF voltage on the two electrodes confining that current. This induced current and its behavior has been studied extensively in the past (F. B. Llewellyn, L. C. Peterson; Proc. IRE, 32. 1944, pgs 144–166; J. Mueller, Hochfrequenztech and Elekt.Akustik 43, pgs 195–199, June 1934; Ch. K. Birdsall, W. B. Bridges, "Electron Dynamics of Diode Regions", Academic Press, New York 1966). Accordingly the first order result of the integration of eq (6) becomes;

$$j_{ind}^{(t)} = j_0 + h\tilde{E}(y_0,z)\sin\omega t[g(\theta)\sin\omega t + b(\theta)\cos\omega t] \tag{7}$$

with

-continued $$\begin{bmatrix} \ldots g(\theta) = g_0 \cdot \frac{2^1}{\theta^2}[2(1 - \cos\theta) - \theta\sin\theta]\ldots \\ \ldots b(\theta) = g_0 \cdot \frac{2^1}{\theta^2}[2\sin\theta - \theta(1 + \cos\theta)]\ldots \\ \ldots g_0 = \frac{j_0}{U}; \theta = \omega T; T = h\left(\frac{2^eU}{m}\right)^{-\frac{1}{2}} \end{bmatrix}$$

The result in eq (7) presumes that the $\tilde{E}$ field $E(y_0, z)$ has an x independent value along the symmetry line of the cross section in the x-y plane. The assumption is closely satisfied. With these results, the incremental power loss/gain at a cross section z along the transmission line may now be calculated according to eqs (5) and (7).

$$\left\langle \frac{dP}{dz} \right\rangle = -\frac{1}{2}|\tilde{E}(y_0,z)|^2 g(\theta) h^2 \tag{8}$$

Figure 5:
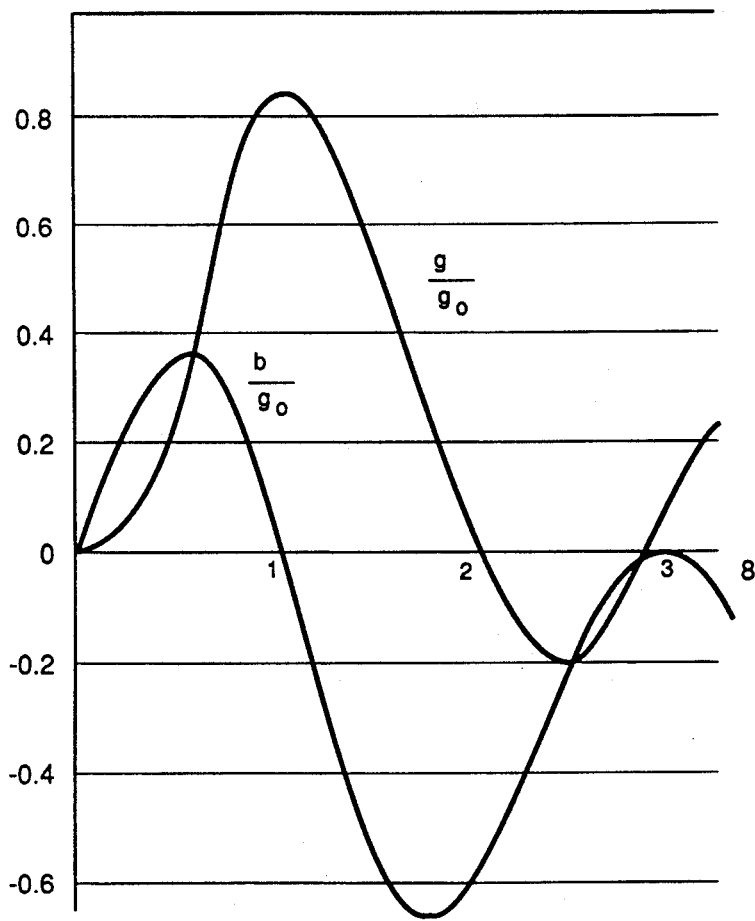
FIG. 5 is a graph showing components of current on the transmission line.

For obvious reasons only the real part of the induced current has been retained. The components $g(\theta)$ and $b(\theta)$ are reproduced graphically in FIG. 5. Of interest is the range of $\theta$ values $$2\pi < \theta_- < 3\pi$$

where $g(\theta_-) < 0$.

In this range the electron flow provides energy to the EM field and the proposed device acts as amplifier. Eq (8) allows now to calculate the logarithmic loss/gain constant $\beta_A$ due to the presence of the electron flow. By definition $$\frac{1}{P}\frac{dP}{dz} = -\beta_A \tag{9}$$

P is the total power of the EM signal going through the line cross section at z $$P = \frac{\epsilon}{2} v_{wave} \int_h^{\cdots}\int_w |\tilde{E}(x,y,z)|^2 \cdot dx dy \tag{10}$$
$$= \frac{1}{2}\epsilon|\tilde{E}(y_0,z)|^2 \cdot v_{wave} \cdot F(w,h)$$

Here $$F(w,h) = \int_w\int_h R^2 dx dy; R^2 = \left[\frac{\tilde{E}(x,y,z)}{\tilde{E}(y_0,z)}\right]^2$$

and $$P \cong \frac{1}{2}\epsilon|\tilde{E}(y_0,z)|^2 \cdot v_{wave} \cdot w \cdot h$$

The useful but crude estimate is obtained by approximation $R^2 = 1$. Then, with the obtained results the loss/gain constant of eq (9) becomes:

$$\beta_A = \frac{1}{2}\frac{1}{v_{wave} \cdot \epsilon}g(\theta)\frac{h}{w} = \frac{1}{2}\cdot g(\theta)\cdot K \tag{11}$$

Here the symbol K represents the characteristic transmission line impedance. Obviously for negative $g(\theta)$ values we obtain amplifier behavior of the transmission line. A more detailed calculation would have to include the passive line losses $\beta_c$. Calculations made elsewhere that include passive line losses $\beta_c$ and make use of the characteristic line impedance Z concept show as result $$\bar{\beta}_A = \beta_L + \frac{1}{2} g(\theta) \cdot K \qquad (12)$$

in which the active term is identical with the one given in above equation (10). At this point attention is directed to the attainment of the transit angle $\theta$ necessary for amplification:

$$2\pi < \theta < 3\pi \qquad (13)$$

which is essential for obtaining negative $g(\theta)$ values. By definition $$\theta = \omega T$$

Therefore the condition for obtaining maximum gain at the frequency $f_c$ is:

$$T = \frac{5}{4} \frac{1}{f_c} \qquad (14)$$

The transit time T on the other hand is given by the other relation $$T = h \left( \frac{2eU}{m} \right)^{-\frac{1}{2}} \qquad (15)$$

where eU is the electron kinetic energy in the final interelectrode space of a tetrode. Therefore the height of the stripline must be chosen to be $$h = \frac{5}{4} \frac{1}{f_c} \left( \frac{2e \cdot U}{m} \right)^{-\frac{1}{2}} \qquad (16)$$

$$= 7.412 \cdot 10^{-2} \frac{(U/\text{Volt})^{\frac{1}{2}}}{f_c/\text{GHz}} \ldots \text{cm}$$

From eq (13) it becomes evident that the electronic bandwidth for amplification is bounded by:

$$\frac{\Delta f}{f_c} < \frac{\pi}{\frac{5}{2}\pi} = 40\% \qquad (17)$$

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. An RF amplifier for electromagnetic signals comprising:
    a RF source of electromagnetic waves;
    a single waveguiding structure extending longitudinally in a direction of propagation of said electromagnetic waves, the waveguiding structure being part of an evacuated enclosure;
    means for introducing electromagnetic waves from said RF source into said waveguiding structure;
    current injection means providing an electron flow which is injected into the waveguiding structure, the electron flow having a current flow vector orientation transverse to the direction of propagation of said electromagnetic waves, wherein density of current flow is not RF modulated;
    wherein a transverse E-field component vector of the electromagnetic waves interacts with said electron flow to produce an increase in the energy level of said electromagnetic waves by transit time effects;
    and means for collecting said electron flow after interaction with said electromagnetic waves.

2. An RF amplifier according to claim 1, wherein said waveguiding structure comprises a metallic top strip and a metallic ground strip separated by two insulators extending in the longitudinal direction to form an inverted metallic stripline with dielectrically closed sides having first and second ends;
    wherein said means for introducing electromagnetic waves from said RF source into said waveguiding structure includes a first RF transparent dielectric window closing the first end of the waveguiding structure, and wherein a second RF transparent dielectric window closes the second end of the waveguiding structure for output of the electromagnetic waves;
    wherein there is a first slot extending longitudinally along the metallic ground strip for the electron flow from the electron source, and a second slot extending longitudinally along the metallic top strip for the electron flow to leave the waveguiding structure;
    wherein said current injection means is enclosed in a structure which straddles the first slot over its entire length outside the waveguiding structure and forms part of the evacuated enclosure; and wherein said means for collecting said electron flow comprises a collector which straddles the second slot over its entire length outside the waveguiding structure and forms part of the evacuated enclosure.

3. An RF amplifier according to claim 2, wherein said current injection means comprises a linearly arrayed group of wedge-shaped field emitters which are a cathodic source of electrons.

4. An RF amplifier according to claim 2, wherein said current injection means comprises a linearly arrayed group of cone-shaped field emitters which are a cathodic source of electrons.

5. An RF amplifier according to claim 2, wherein said current injection means comprises a linearly arrayed group of field emitters which are a cathodic source of electrons, and electrode means located between the field emitters and the first slot.

6. An RF amplifier according to claim 5, wherein the electrode means includes gate electrode means and further electrode means for beam current shaping and velocity adjustments.

7. An RF amplifier according to claim 6, wherein said field emitters are wedge-shaped.

* * * * *